(12) United States Patent
Mihajlovic et al.

(10) Patent No.: US 10,276,783 B2
(45) Date of Patent: Apr. 30, 2019

(54) GATE VOLTAGE CONTROLLED PERPENDICULAR SPIN ORBIT TORQUE MRAM MEMORY CELL

(71) Applicant: SANDISK TECHNOLOGIES LLC, Plano, TX (US)

(72) Inventors: Goran Mihajlovic, San Jose, CA (US); Jeffrey S. Lille, Sunnyvale, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 15/618,878

(22) Filed: Jun. 9, 2017

(65) Prior Publication Data
US 2018/0358542 A1    Dec. 13, 2018

(51) Int. Cl.
| | | |
|---|---|---|
| *G11C 11/16* | (2006.01) | |
| *H01L 43/06* | (2006.01) | |
| *H01L 27/22* | (2006.01) | |
| *H01L 43/08* | (2006.01) | |
| *H01L 43/10* | (2006.01) | |
| *H01L 43/14* | (2006.01) | |
| *H01L 43/02* | (2006.01) | |
| *H01L 43/12* | (2006.01) | |

(52) U.S. Cl.
CPC ............ *H01L 43/06* (2013.01); *G11C 11/161* (2013.01); *G11C 11/1673* (2013.01); *G11C 11/1675* (2013.01); *H01L 27/228* (2013.01); *H01L 43/02* (2013.01); *H01L 43/08* (2013.01); *H01L 43/10* (2013.01); *H01L 43/12* (2013.01); *H01L 43/14* (2013.01)

(58) Field of Classification Search
CPC ................... G11C 13/0069; G11C 13/0004

USPC .......................................... 365/148
See application file for complete search history.

(56) References Cited

U.S. PATENT DOCUMENTS

| | | | |
|---|---|---|---|
| 5,500,633 A  * | 3/1996 | Saito ................. | H01L 43/10 257/E43.005 |
| 6,727,537 B2 | 4/2004 | Wunderlich | |
| 7,781,231 B2 * | 8/2010 | Li ........................ | B82Y 25/00 257/295 |

(Continued)

OTHER PUBLICATIONS

Makarov, et al., "SOT-MRAM based on 1Transistor-1MTJ-Cell Structure," 15th Non-Volatile Memory Technology Symposium, 2015.

(Continued)

*Primary Examiner* — Huan Hoang
*Assistant Examiner* — Minh Dinh
(74) *Attorney, Agent, or Firm* — Vierra Magen Marcus LLP

(57) ABSTRACT

A four terminal magnetoresistive memory cell comprises a magnetic tunnel junction stack, a ferroelectric layer and a non-ferromagnetic spin polarization layer between the magnetic tunnel junction stack and the ferroelectric layer. The magnetic tunnel junction includes a first layer with fixed direction of magnetization, a free layer capable of changing direction of magnetization and an insulation layer between the first layer and the free layer. The non-ferromagnetic spin polarization layer is configured to generate perpendicular spin polarization in response to electrical current through the non-ferromagnetic spin polarization layer and a voltage received at the ferroelectric layer. The perpendicular spin polarization applies a torque on the free layer to change direction of magnetization of the free layer.

18 Claims, 12 Drawing Sheets

(56) References Cited

U.S. PATENT DOCUMENTS

| | | | |
|---|---|---|---|
| 8,669,165 B2* | 3/2014 | Han | H01L 21/28176 |
| | | | 257/E21.008 |
| 9,076,954 B2* | 7/2015 | Khvalkovskiy | H01L 43/02 |
| 9,343,658 B2 | 5/2016 | Wang | |
| 9,779,797 B2* | 10/2017 | Ino | G11C 11/2273 |
| 10,008,248 B2* | 6/2018 | Buhrman | H01L 43/08 |
| 2006/0023496 A1 | 2/2006 | Aouba | |
| 2010/0102369 A1 | 4/2010 | Tian | |
| 2014/0001524 A1 | 1/2014 | Manipatruni | |
| 2014/0264511 A1 | 9/2014 | DeBrosse | |
| 2015/0041934 A1 | 2/2015 | Khvalkovskiy | |
| 2016/0267961 A1 | 9/2016 | Lee | |

OTHER PUBLICATIONS

Sagasta, et al., "Tuning the spin Hall effect of Pt from the moderately dirty to the superclean regime," Physical Review B, vol. 94, Aug. 30, 2016.

Shimizu, "Electrically Tunable Anomalous Hall Effect in Pt Thin Films," Physical Review Letters 111, 216803, Nov. 2013.

Zhang, et al., "Current-induced spin polarization on metal surfaces probed by spin-polarized positron beam," Scientific Reports, Apr. 29, 2014.

* cited by examiner

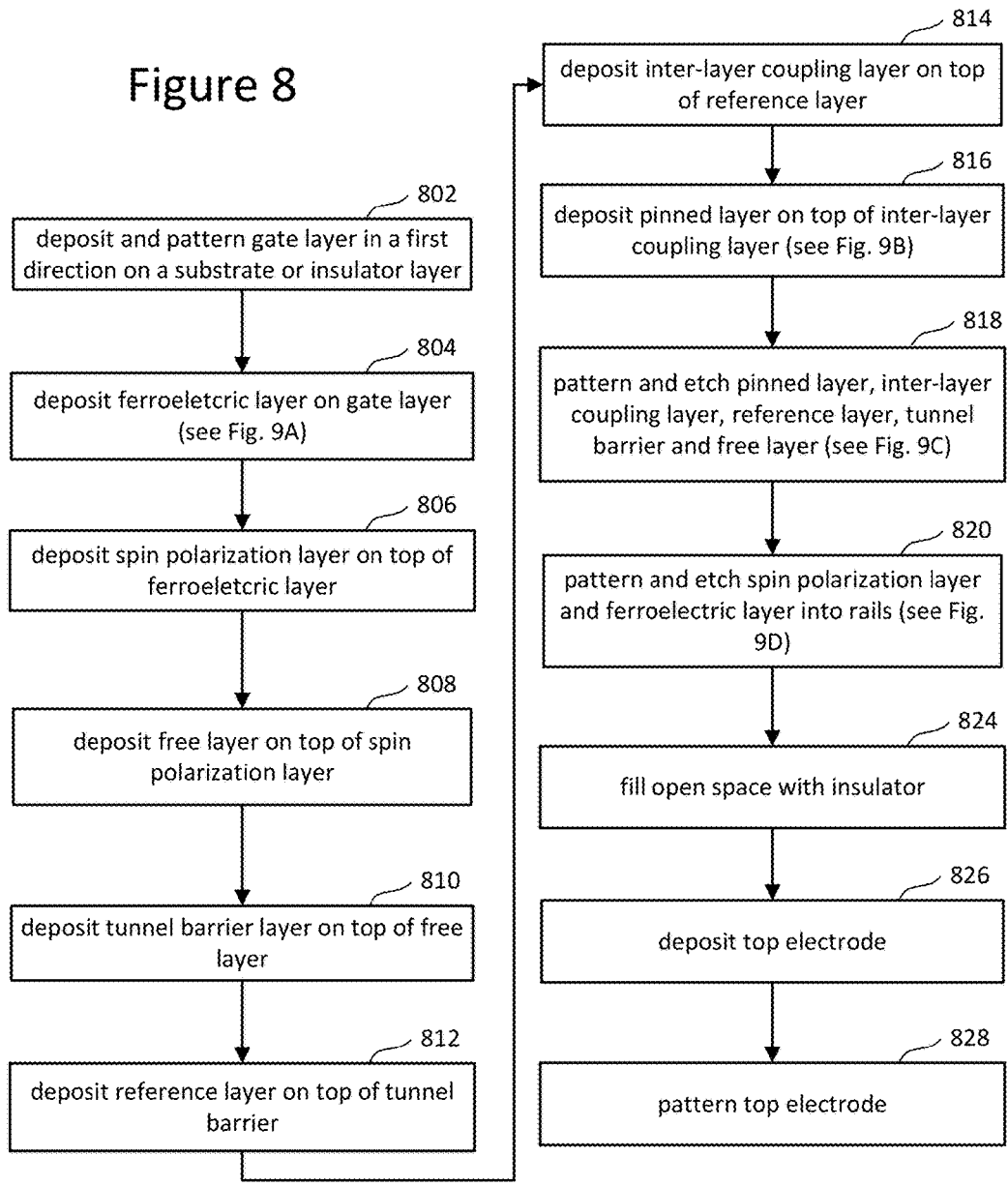

US 10,276,783 B2

GATE VOLTAGE CONTROLLED PERPENDICULAR SPIN ORBIT TORQUE MRAM MEMORY CELL

BACKGROUND

Memory is widely used in various electronic devices such as cellular telephones, digital cameras, personal digital assistants, medical electronics, mobile computing devices, non-mobile computing devices and data servers. Memory may comprise non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to other memory technologies that use electronic charges to store data. Generally, MRAM includes a large number of magnetic memory cells formed on a semiconductor substrate, where each memory cell represents one data bit. A bit of data is written to a memory cell by changing the direction of magnetization of a magnetic element within the memory cell, and a bit is read by measuring the resistance of the memory cell (e.g., low resistance typically represents a "0" bit and high resistance typically represents a "1" bit).

Although MRAM is a promising technology, previous MRAM memory was unreliable, operated inefficiently and/ or did not switch deterministically.

BRIEF DESCRIPTION OF THE DRAWINGS

Like-numbered elements refer to common components in the different figures.

FIG. 8 is a flow chart describing one embodiment of a process for manufacturing the MRAM memory cell of FIG. 1.

DETAILED DESCRIPTION

A magnetoresistive random access memory cell is proposed that comprises a magnetic tunnel junction stack, a ferroelectric layer and a non-ferromagnetic spin polarization layer between the magnetic tunnel junction stack and the ferroelectric layer. One embodiment of the magnetic tunnel junction includes a first layer with fixed direction of magnetization, a free layer capable of changing direction of magnetization and an insulation layer between the first layer and the free layer. The non-ferromagnetic spin polarization layer is configured to generate perpendicular spin polarization in response to electrical current through the non-ferromagnetic spin polarization layer and a voltage received at the ferroelectric layer. The perpendicular spin polarization applies a torque on the free layer to change direction of magnetization of free layer.

Figure 1:
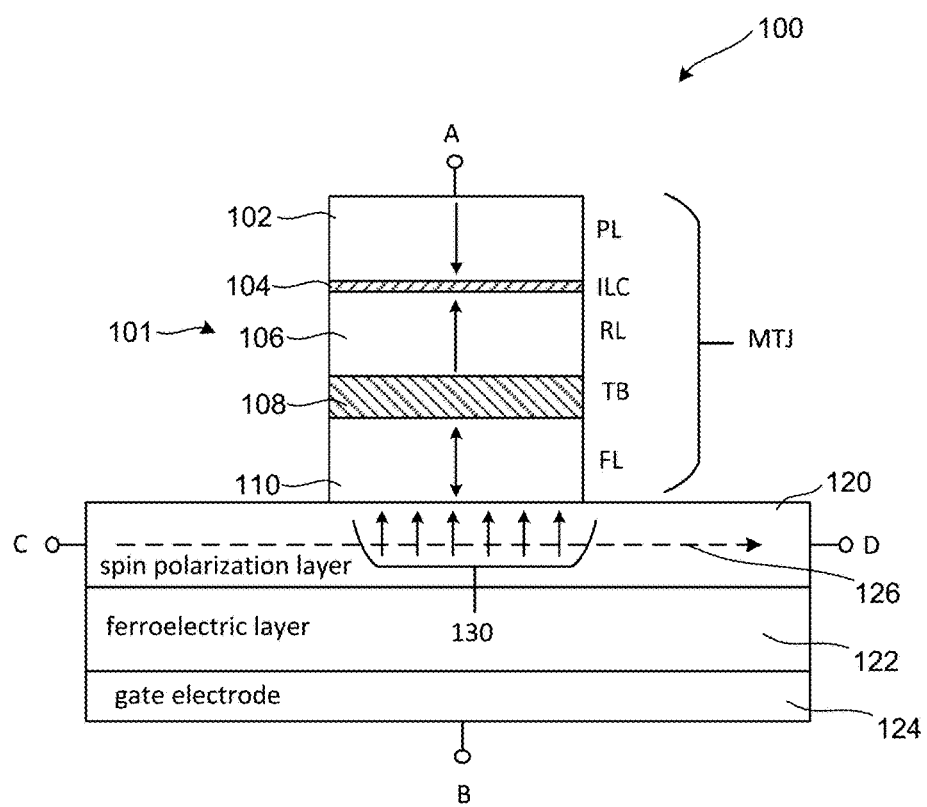
FIG. 1 is a block diagram of a MRAM memory cell.

FIG. 1 is a schematic perspective view of one embodiment of the proposed MRAM memory cell 100 that makes use of spin orbit torque (SOT) for switching. For purposes of this document, a memory cell is a unit of storage in a memory system. Memory cell 100 includes four terminals A, B, C and D; magnetic tunnel junction (MTJ) stack 101; non-ferromagnetic spin polarization layer 120 (also referred to as a metal layer), ferroelectric layer 122, and gate electrode 124.

In general, a magnetic tunnel junction (MTJ) is an apparatus comprising two ferromagnets separated by a thin insulator. Thus, one embodiment of MTJ stack 101 includes a pinned layer, a free layer and a tunnel barrier (insulation layer) between the pinned layer and the free layer. MTJ stack 101 can also have more than three layers. For example, as depicted in FIG. 1, MTJ stack 101 comprises pinned layer (PL) 102, inter-layer coupling (ILC) layer 104, reference layer (RL) 106, tunnel barrier (TB) 108 and free layer (FL) 110. Pinned layer 102 and reference layer 106 have fixed directions of magnetization, meaning that their direction of magnetization does not change. Pinned layer 102 can be many different types of materials including (but not limited to) multiple layers of Cobalt and/or an alloy of Cobalt and Iron. Reference layer 106 can be many different types of materials including (but not limited to) multiple layers of Cobalt and an alloy of Cobalt, Iron and Boron. In one example, ILC layer 104 is made of Ruthenium; however, other materials can also be used. Pinned layer 102 has a direction of magnetization that is opposite in direction to reference layer 106. For example, FIG. 1 shows the direction of magnetization of pinned layer 102 being down and the direction of magnetization of reference layer 106 being up. The direction of magnetization for both pinned layer 102 and reference layer 106 are perpendicular to the in-plane direction. To a large degree, the magnetization of reference layer 106 cancels out the magnetization of pinned layer 102 (or vice versa) to create in aggregate a combined layer with close to zero net magnetization. The ILC layer 104 promotes this antiparallel (i.e. antiferromagnetic) coupling between pinned layer 102 and reference layer 106. Pinned layer 102 is connected to terminal A (the first terminal).

In one embodiment, tunnel barrier 108 is made of Magnesium Oxide (MgO); however, other materials can also be used. Tunnel barrier 108 is positioned between free layer 110 and the one or more layers of fixed magnetization; therefore, in one embodiment tunnel barrier 108 is positioned between free layer 110 and reference layer 106. Free layer 110 is a ferromagnetic metal that possess the ability to change/switch its direction of magnetization. Multilayers based on transition metals like Co, Fe and their alloys can be used to form free layer 110. In one embodiment, free layer 110 comprises an alloy of Cobalt, Iron and Boron. In one embodiment, free layer 110 has a direction of magnetization that can be switched between up and down. Thus, the direction of magnetization of free layer 110 is perpendicular to the in-plane direction.

If the direction of magnetization of free layer 110 is parallel to the direction of magnetization of the reference layer 106, then memory cell 100 has a lower resistance. If the direction of magnetization of free layer 110 is antiparallel to the direction of magnetization of the reference layer 106, then memory cell 100 has a higher resistance. In some embodiments, low resistance represents a "0" bit and high resistance represents a "1" bit, or vice versa.

Ferroelectric layer 122 is a ferroelectric substance that exhibits permanent electric polarization that varies in strength with the applied electric field. One example of ferroelectric layer 122 is $Hf_{0.5}Zr_{0.5}O_2$ having a thickness of less than 20 nm. In other embodiments, ferroelectric layer 122 is $Hf_{0.5}Zr_{0.5}O_2$ having a thickness of less than 30 nm. One implementation includes a 10 nm think polarized film of $Hf_{0.5}Zr_{0.5}O_2$ annealed at 350 degrees Celsius to create an orthorhombic phased layer. Gate electrode 124, positioned below ferroelectric layer 122, is a standard metal lead, such as copper. Terminal B (the second terminal) is connected to gate electrode 124. Terminal B is said to be connected to ferroelectric layer 122; however, terminal B can be thought of as being part of or the same as gate electrode 124.

Spin polarization layer 120 is a non-ferromagnetic metal layer. In some embodiments, spin polarization layer 120 is a heavy metal, such as Platinum (Pt). In other embodiments, other metals can be used including Tungsten or metals heavier than Tungsten. Spin polarization layer 120 is positioned between the magnetic tunnel junction stack 101 and the ferroelectric layer 124.

In some previous MRAM memory cells, a Platinum layer is used below the MTJ stack as a Spin Hall Effect (SHE) layer. In general, SHE may be used to generate spin current flowing in a transverse (perpendicular to plane) direction when applying a charge current flow in a longitudinal (in-plane) direction. The spin polarization direction of such an SHE-generated spin current is in the in-plane direction orthogonal to the charge current flow. A SHE layer is typically a heavy metal with high spin-orbit coupling (and generally corresponding to short spin diffusion length), for example, Platinum. If a current is run in-plane through the SHE layer, spin polarized current is generated in perpendicular direction (flowing up towards the FL) and exerts torque on free layer 110 via spin transfer mechanism and can switch the direction of magnetization of free layer 110. However, because the spin polarization direction of such an SHE-generated spin current is in the in-plane direction, the spin current is highly inefficient in its ability to switch the direction of magnetization of free layer 110 which is perpendicular. Thus, if memory cell 100 did not have ferroelectric layer 122, running a current in the in-plane direction (e.g. x-direction) between terminals C and D would lead to the generation of spin current in the orthogonal direction (flowing up towards the FL 110) with spin polarization direction of such a SHE-generated spin current being in the in-plane direction orthogonal (e.g. y-direction) to the current flow between terminals C and D.

It has been observed that by applying a positive gate bias (voltage), the sheet resistance of Platinum drastically decreases and, simultaneously, the anomalous Hall Effect emerges in the initially non-magnetic Platinum layer causing the Platinum layer to show magnetic properties. Thus, it is proposed to position ferroelectric layer 122 adjacent to the Platinum spin polarization layer 120, either immediately adjacent or with an intervening material(s). An external voltage received at ferroelectric layer 122 creates an electric field across the ferroelectric layer 122 to alter spin current generated in the non-ferromagnetic spin polarization layer 120 to generate perpendicular spin polarization that applies a torque to the magnetic tunnel junction stack. That is, by applying a positive gate voltage that generates an electric field across the ferroelectric layer 122 that is less than 1V/nm via terminal B (and or terminal C) and gate electrode 124 while applying an electrical current in the in-plane direction between terminals C and D (see e.g. electrical current 126 from terminal C to terminal D), the spin polarization layer 120 (e.g., comprised of Platinum) generates spin polarization in the perpendicular direction (i.e., perpendicular to the in-plane direction) such as up or down. For example, FIG. 1 shows spin polarization 130 with perpendicular direction of up at the interface between polarization layer 120 and free layer 110. Thus, spin polarization layer 120 generate perpendicular spin polarization in response to electrical current through the non-ferromagnetic spin polarization layer 120 and a voltage received at the ferroelectric layer 122. The perpendicular spin polarization applies a torque on free layer 110 to change direction of magnetization of free layer 110. The perpendicular spin polarization is more efficient than the in-plane spin polarization of MRAM memory cells with traditional SHE layers and allows for the switching of the free layer 110 more deterministically without using an external magnetic field.

The data ("0" or "1") stored in memory cell 100 is read by measuring the resistance of the memory cell 100. Reading is achieved by passing an electrical current between terminal A and either of terminal C or terminal D in order to sense the resistance of memory cell 100.

Some previous MRAM devices were two terminal memory cells that included shared read and write paths through the magnetic tunnel junction. The shared read and write paths created problems for endurance and reliability. For writing, the tunnel barrier layer in the magnetic tunnel junction should be sufficiently thin (and have relatively low enough resistance) to flow a current necessary for switching. However, a thin barrier layer is more susceptible to dielectric breakdown due to repeated write operations. The new proposed design of FIG. 1 does not requires a write current that passes through the tunnel barrier 108. While spin current may diffuse into FL 110, the write current 126 is passed through spin polarization layer 120 and not through MTJ 101. That is, the generated perpendicular spin polarization discussed above diffuses into free layer 110 and exerts a torque on the free layer 110 to change direction of magnetization of free layer 110 without a high electrical current passing through tunnel barrier 108 (the insulation layer). In some embodiment, the generated perpendicular spin polarization exerts a torque on the free layer to change direction of magnetization of the free layer without an electrical current through the insulation layer that is greater than 1 MA/cm2. Note that perpendicular spin polarization 130 in spin polarization layer 120 can also affect magnetization of the FL 110 and eventually even switch it via field-like torque due to effective dipolar magnetic field generated by these spin polarized electrons in the perpendicular direction. This contribution, however, should be less efficient than the above mentioned spin diffusion into the FL 101, as it acts directly against perpendicular anisotropy field of the FL 101.

Although it is discussed above that some embodiments of the structure of FIG. 1 write data by having the perpendicular spin polarization exert a torque on the free layer without an electrical current running through the magnetic tunnel junction stack, other embodiments write data by having the perpendicular spin polarization exert a torque on the free layer while a small electrical current runs through the magnetic tunnel junction stack. For example, in one embodiment, the generated perpendicular spin polarization exerts a torque on the free layer to change direction of magnetization of the free layer without an electrical current through the insulation layer that is greater than 1 MA/cm2.

Some embodiments may include a spacer between spin polarization layer 120 and free layer 110 to enhance the coupling, while in other embodiments spin polarization layer 120 is directly adjacent and touching free layer 110.

In one embodiment, spin polarization layer 120, ferroelectric layer 122, gate electrode 124 (including terminal B) provide a means for generating electrical current induced perpendicular spin polarization that applies a torque on free layer 110 to change direction of magnetization of free layer 110.

Figure 2:
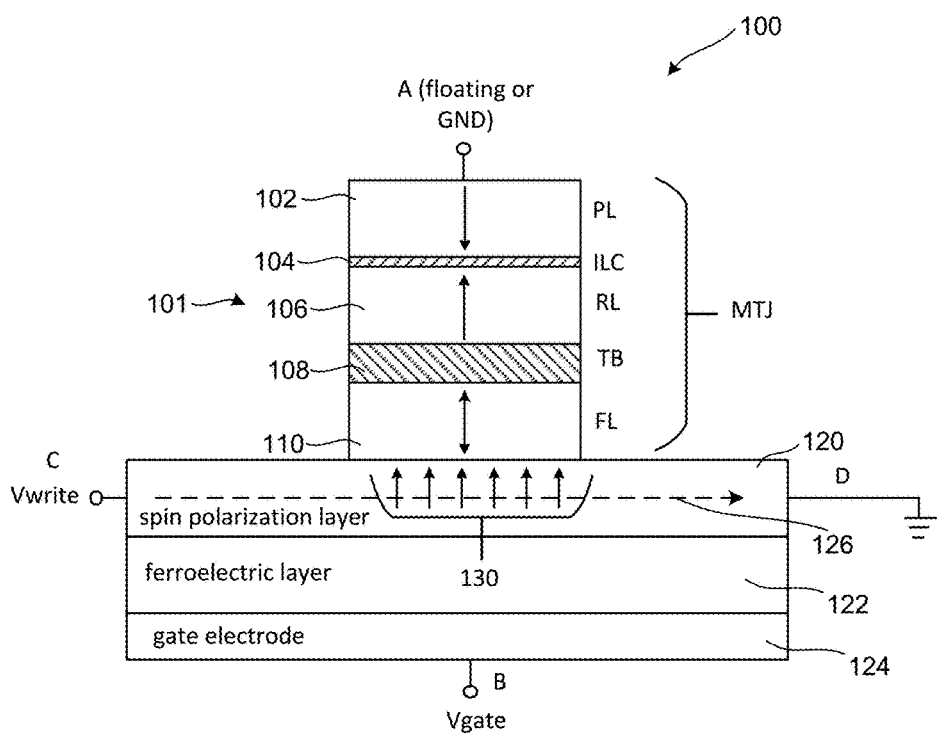
FIG. 2 is a block diagram of a MRAM memory cell during a writing operation.
Figure 3:
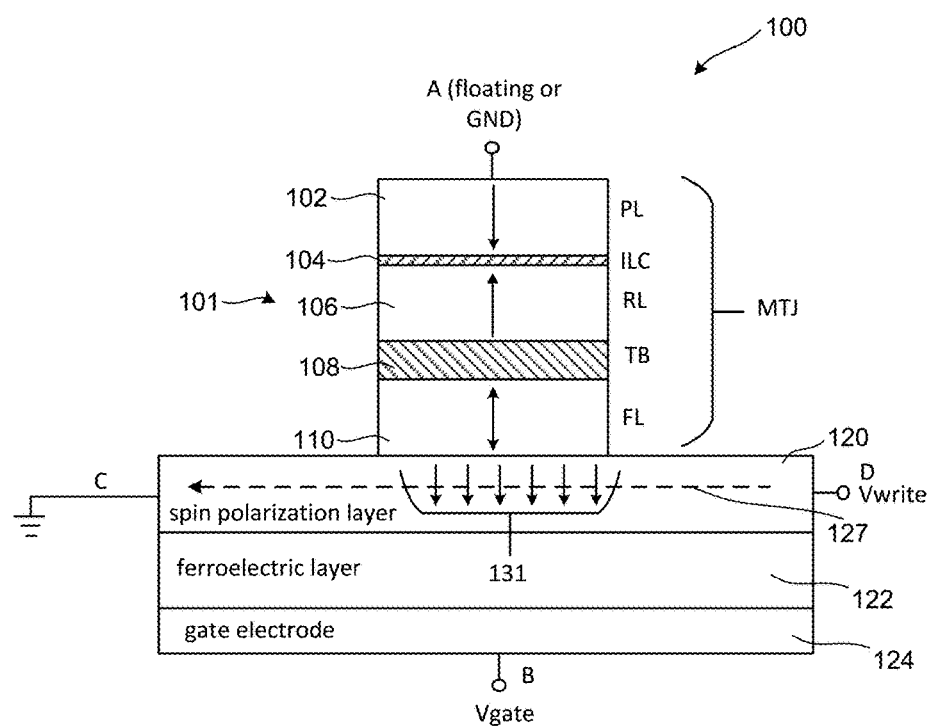
FIG. 3 is a block diagram of a MRAM memory cell during a writing operation.

FIGS. 2 and 3 depict memory cell 100 during writing operations. FIG. 2 shows memory cell 100 have first data being written such that free layer 110 has its direction of magnetization being changed to a first direction (e.g., up) and FIG. 3 shows memory cell 100 have second data being written such that free layer 110 has its direction of magnetization being changed to a second direction (e.g., down.). Thus, the first data is a different data value than the second data, for example, the first data can be a "1" and the second data can be a "0," or vice versa.

FIG. 2 shows terminal A floating or at ground. A small voltage can also be used. In some embodiments, during a write operation, the signal at terminal A does not matter; however, to avoid disturbs or degradation to tunnel barrier 108 terminal A is set to ground, floating or a very low voltage. Terminal C is connected to a write voltage Vwrite that is generally less than 2 V and Terminal D is connected to ground so that electrical current 126 flows in a longitudinal (in-plane) direction from Terminal C to Terminal D. One should note that terminal D does not have to be at ground, but merely at a different voltage as compared to terminal C. The voltage Vgate is applied to Terminal B. Non-ferromagnetic spin polarization layer 120 generates perpendicular spin polarization 130 in response to electrical current 126 passing through the non-ferromagnetic spin polarization layer 120 and Vgate received at the ferroelectric layer 122. The perpendicular spin polarization 130 diffuses into free layer 110 and applies a torque on free layer 110 to change direction of magnetization of free layer 110 to the first direction (e.g., up).

FIG. 3 shows terminal A floating or at ground. A small voltage can also be used. In some embodiments, during a write operation, the signal at terminal A does not matter; however, to avoid disturbs or degradation to tunnel barrier 108 terminal A is set to ground, floating or a very low voltage. Terminal D is connected to a write voltage Vwrite and Terminal C is connected to ground so that electrical current 127 flows in a longitudinal (in-plane) direction from Terminal D to Terminal C. Vgate is applied to Terminal B. Non-ferromagnetic spin polarization layer 120 generates perpendicular spin polarization 131 in response to electrical current 127 passing through the non-ferromagnetic spin polarization layer 120 and Vgate received at the ferroelectric layer 122. The perpendicular spin polarization 131 diffuses into free layer 110 and applies a torque on free layer 110 to change direction of magnetization of free layer 110 to the second direction (e.g., down).

Figure 4:
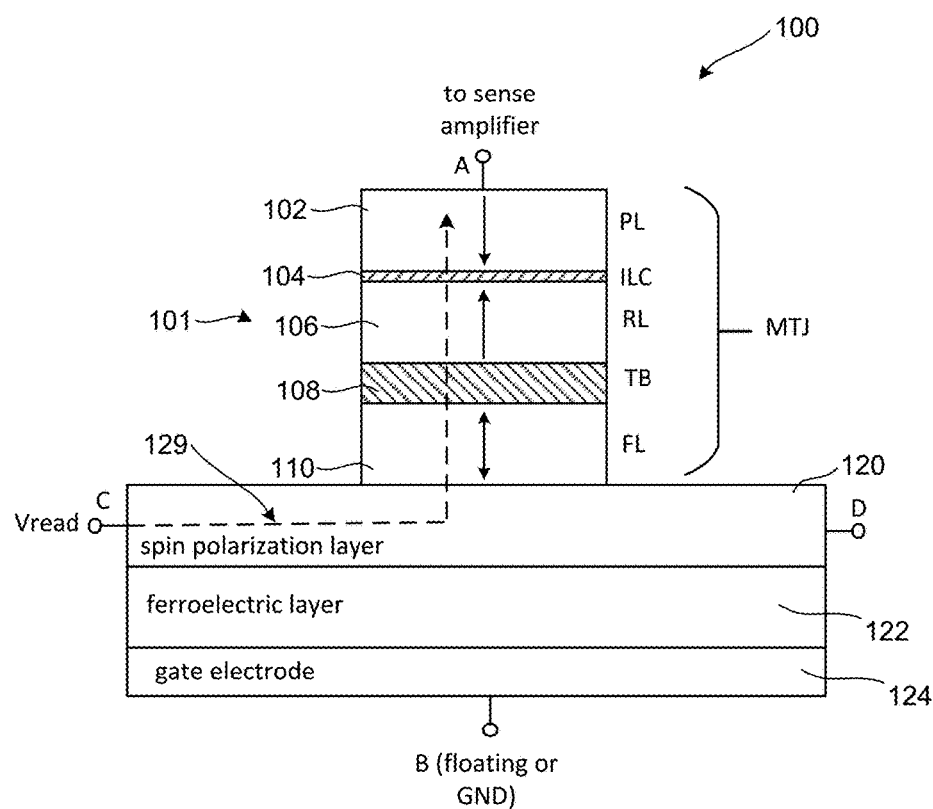
FIG. 4 is a block diagram of a MRAM memory cell during a reading operation.

FIG. 4 depicts memory cell 100 during a reading operation. FIG. 4 shows terminal B floating or at ground. A small voltage can also be used. The voltage Vread of 0.1-0.5 V is applied to terminal C. Terminal D is not connected or floating. Therefore, current will pass between terminal A and C. In another embodiment, the voltage Vread is applied to terminal D, and terminal C is not connected to the device which will result in current passing between terminals A and D. Terminal A is connected to a sense amplifier, for sensing current 129. In this case, the sense amplifier measures the magnitude of the current 129 through MTJ 101 (from terminal C or D to terminal A). The resistance of MTJ 101 is determined based on the measured current. In one embodiment, if the sense amplifier measures a high resistance than the system concludes that a "1" bit is stored and if the sense amplifier measures a low resistance than the system concludes that a "0" bit is stored, or vice versa.

In summary, FIG. 2 depicts applying an electrical current 126 in a first direction across a non-ferromagnetic spin polarization layer that is positioned between a magnetic tunnel junction stack 101 and a ferroelectric layer 122, and applying a voltage Vgate to the ferroelectric layer 122 while applying the electrical current to generate perpendicular spin polarization 130 in the non-ferromagnetic spin polarization layer 126 that applies a torque to the magnetic tunnel junction stack 101 (e.g., to free layer 110) to change direction of magnetization of a portion of the magnetic tunnel junction stack (e.g., to free layer 110). FIG. 3 depicts applying an electrical current 127 in a second direction across the non-ferromagnetic spin polarization layer 120, where the applying the electrical current in the first direction results in writing first data to the magnetic tunnel junction stack and the applying the electrical current in the second direction results in writing second data to the magnetic tunnel junction stack. The first data is a different data value than the second data. FIG. 4 depicts applying a current 120 through the magnetic tunnel junction stack 101 to sense resistance of the magnetic tunnel junction stack 101 and read data stored in the magnetic tunnel junction stack 101 (e.g., stored in free layer 110).

Figure 5:
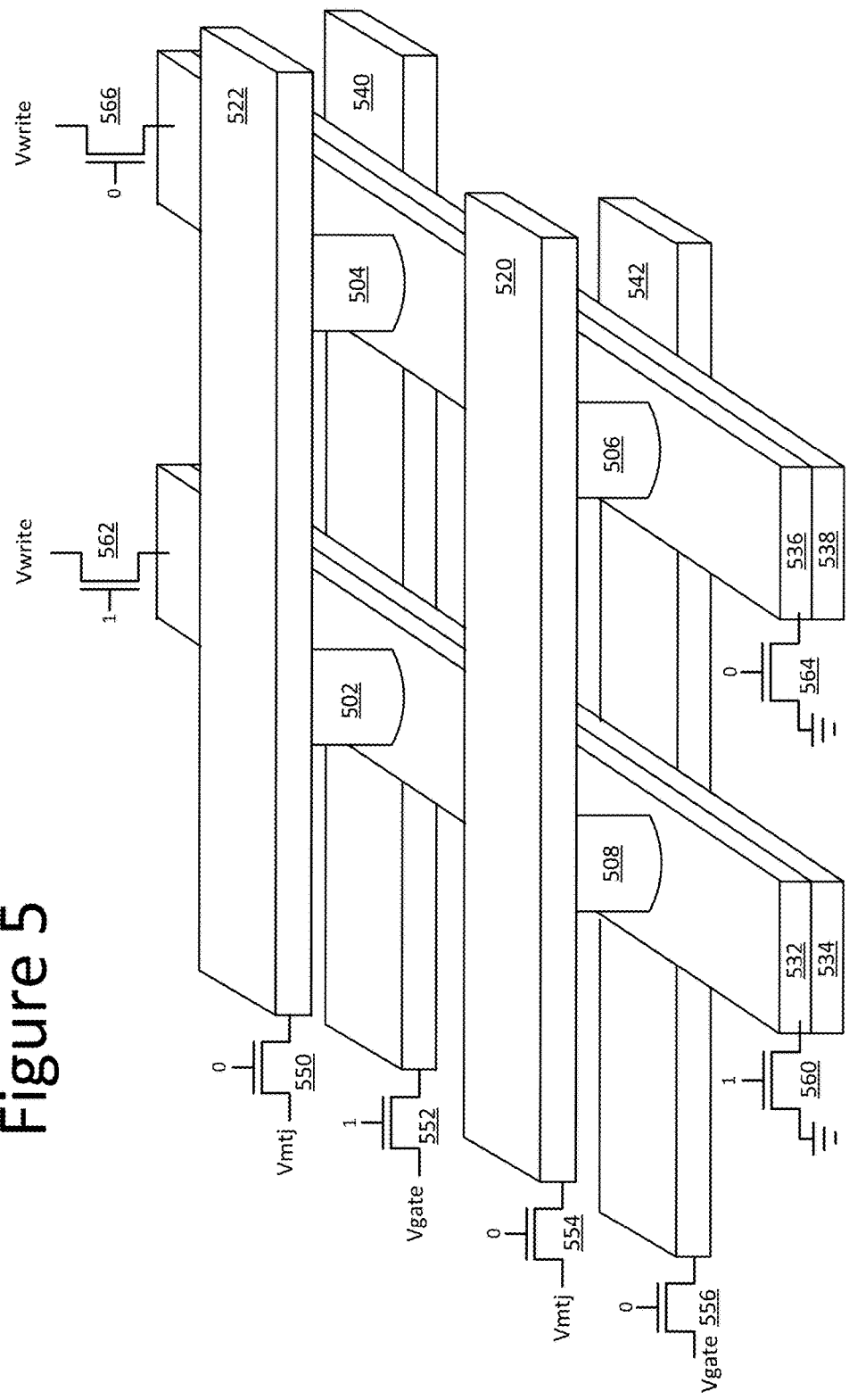
FIG. 5 depicts a portion of a cross point array during a writing operation.

FIG. 5 depicts a portion of a cross point memory array that includes a plurality of MRAM non-volatile memory cells having the structure depicted in FIG. 1. Although the cross point memory array includes thousands or millions of memory cells, only four memory cells are depicted in FIG. 5. The four memory cells correspond to magnetic tunnel junction stacks 502, 504, 506 and 508, each of which is the structure of magnetic tunnel junction stack 101 depicted in FIG. 1. Above magnetic tunnel junction stacks 506 and 508 is top electrode 520 in the shape of a rail. Above magnetic tunnel junction stacks 502 and 504 is top electrode 522 in the shape of a rail. The top electrodes are analogous to terminal A of FIG. 1.

Below magnetic tunnel junction stacks 502 and 508 are two layers, spin polarization layer 532 and ferroelectric layer 534, which in combination are in the shape of a rail. Below magnetic tunnel junction stacks 504 and 506 are two layers, spin polarization layer 536 and ferroelectric layer 122, which in combination are in the shape of a rail. Spin polarization layers 532 and 536 are the same structure as spin polarization layer 120 of FIG. 1. Ferroelectric layers 534 and 538 are the same structure as ferroelectric layer 122 of FIG. 1. The rails making up the spin polarization layers/ferroelectric layers 532/534 and 536/538 are elongated in a direction that is orthogonal to the top electrodes 520 and 522.

Below magnetic tunnel junctions 506/508 and below the rails comprising spin polarization layers/ferroelectric layers 532/534 and 536/538 is a gate electrode 542. Below magnetic tunnel junctions 502/504 and below the rails comprising spin polarization layers/ferroelectric layers 532/534 and 536/538 is a gate electrode 540. Gate electrodes 540 and 542 are analogous to gate electrode 124 of FIG. 1 (and may also include terminal D of FIG. 1). Gate electrodes 540/542 are elongated in a direction that is orthogonal to spin polarization layers/ferroelectric layers 532/534 and 536/538.

FIG. 5 also shows transistors 550, 552, 554, 556, 560, 562, 564, and 566. Transistor 550 connects top electrode 522 to the voltage Vmtj, which can be a small voltage, zero volts or ground. During one embodiment of a write operation, no voltage is applied to the top electrode (to terminal A); therefore, transistor 550 and transistor 554 are off (receiving a logic zero at their gate).

Transistor 552 connects bottom gate electrode 540 to Vgate and transistor 556 connects bottom gate electrode 542 to Vgate. In the example of FIG. 5, the memory cell that includes magnetic tunnel junction stack 502 is selected for writing and the other three depicted memory cells are unselected. Therefore, bottom gate electrode 540 is connected to the voltage Vgate by transistor 552 in response to a logic one provided at the gate of transistor 552. Analogously, the gate of transistor 556 receives a zero to turn off transistor 556 because the memory cells for magnetic tunnel junctions 508 and 506 are not selected for the write operation.

Transistors 560 and 562 are connected to spin polarization layer 532. These transistors are analogous to terminals C and D of FIG. 1. Transistor 560 receives a logic one to turn on and connect one end of spin polarization layer 532 to ground and transistor 562 receives a logic one at its gate to connect the other end of spin polarization layer 532 to Vwrite. Thus, while a current is applied across spin polarization layer 532, a voltage is applied to ferroelectric layer 534 via gate electrode 540 to cause the generation of the perpendicular spin polarization in spin polarization layer 532 that will apply a torque on the free layer of magnetic tunnel junction stack 502 to change the direction of magnetization of the free layer. Because the memory cells associated with magnetic tunnel junctions 504 and 506 are both unselected, transistor 564 connecting spin polarization layer 536 to ground and transistor 566 connecting spin polarization layer 536 to Vwrite are both turned off (as a logic 0 is applied to their gate). Analogously, the current direction in polarization layer 532 could be reversed to alter the direction of the spin polarization.

Note that FIG. 5 shows ferroelectric layers 534 and 536 to be orthogonal to gate electrode 540 and gate electrode 542. In another embodiment, ferroelectric layers 534 and 536 are the same size, shape and/or direction as gate electrode 540 and gate electrode 542 so that ferroelectric layers 534 and 536 sit one top of gate electrodes 540 and 542 to form two layer rails with a first rail underneath magnetic tunnel junctions 502/504 and a second rail underneath magnetic tunnel junctions 506/508.

Figure 6:
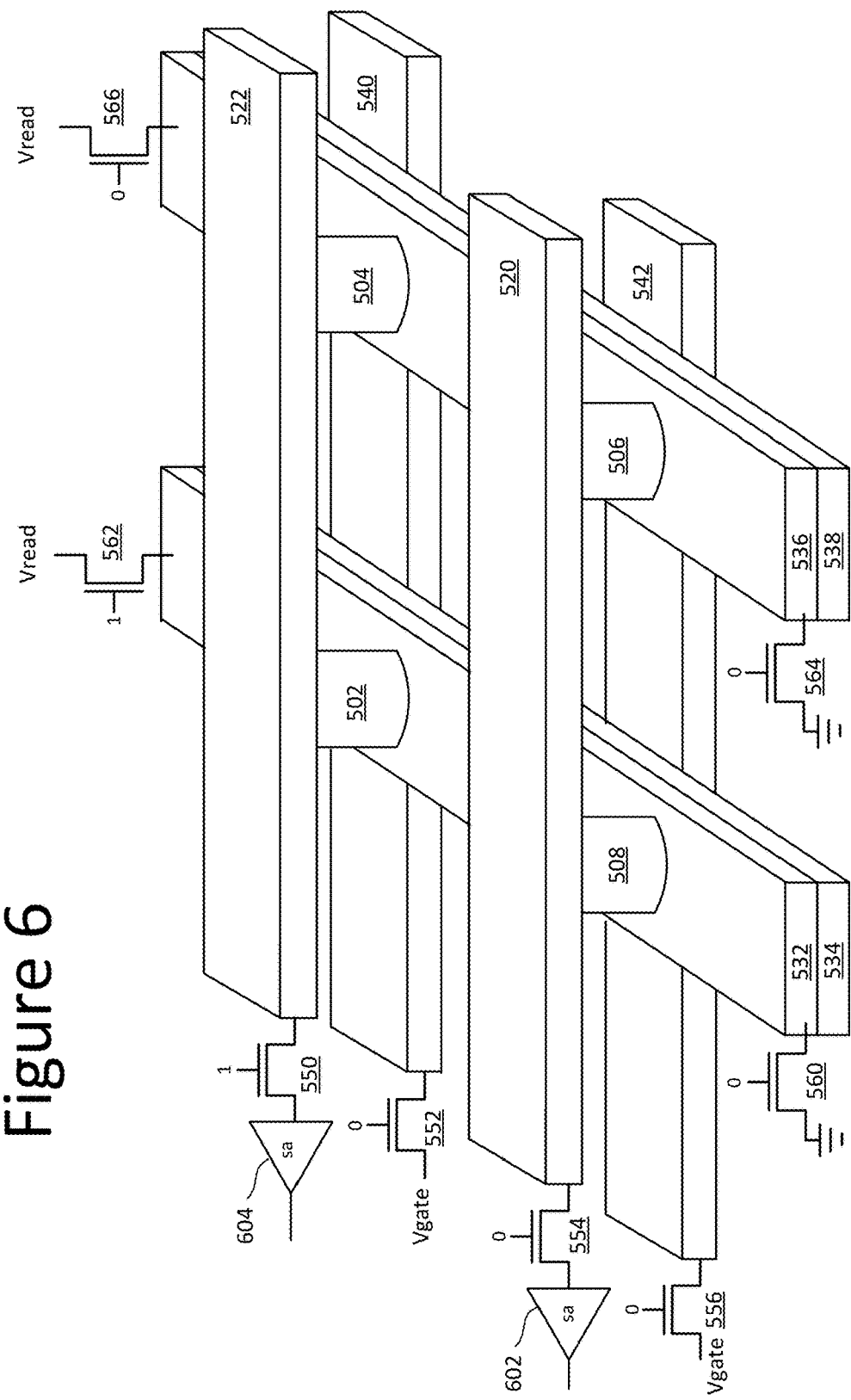
FIG. 6 depicts a portion of a cross point array during a reading operation.

FIG. 6 depicts the same structure as FIG. 5, however, during a reading operation. Top electrodes 520 and 522 are connected to sense amplifiers 602 and 604 via transistors 554 and 550, respectively. Because the memory cell associated with magnetic tunnel junction stack 502 is selected for reading and the other three memory cells depicted in FIG. 6 are unselected, transistor 550 is turned on (receiving a logic 1 at its gate) thereby connecting the magnetic tunnel junction stack 502 to sense amplifier 604 in order to sense the current (and thus, the resistance) through magnetic tunnel junction stack 502. Because memory cells associated with magnetic tunnel junction stacks 506 and 508 are unselected, transistor 554 is off (receiving a logic 0 at its gate). As FIG. 6 depicts a read operation, there is no need for a gate voltage applied to the ferroelectric layers; therefore, transistor 552 and transistor 556 are off (receiving a logic 0 at their gates). Transistor 562 connects spin polarization layer 532 to Vread and transistor 560 is off so that the reading current is flowing through magnetic tunnel junction stack 502. Transistor 566 connects spin polarization layer 536 to Vread and transistor 564 connects spin polarization layer 536 to ground. Since the memory cell associated with magnetic tunnel junction stack 502 is selected, transistor 562 is turned on so that Vread is applied to spin polarization layer 532 in order to drive a current through magnetic tunnel junction stack 502, through to sense amplifier 604. Since the memory cells associated with magnetic tunnel junction stacks 504 and 506 are not selected, transistors 564 and transistor 566 are both turned off (receiving a logic 0 at their gates). An alternative operation is to have transistor 560 and transistor 562 both connected to Vread and have both transistors (560 and 562) turned on. It should be noted that the direction of current sent through the amplifier 604 in that case may be changed.

Figure 7:
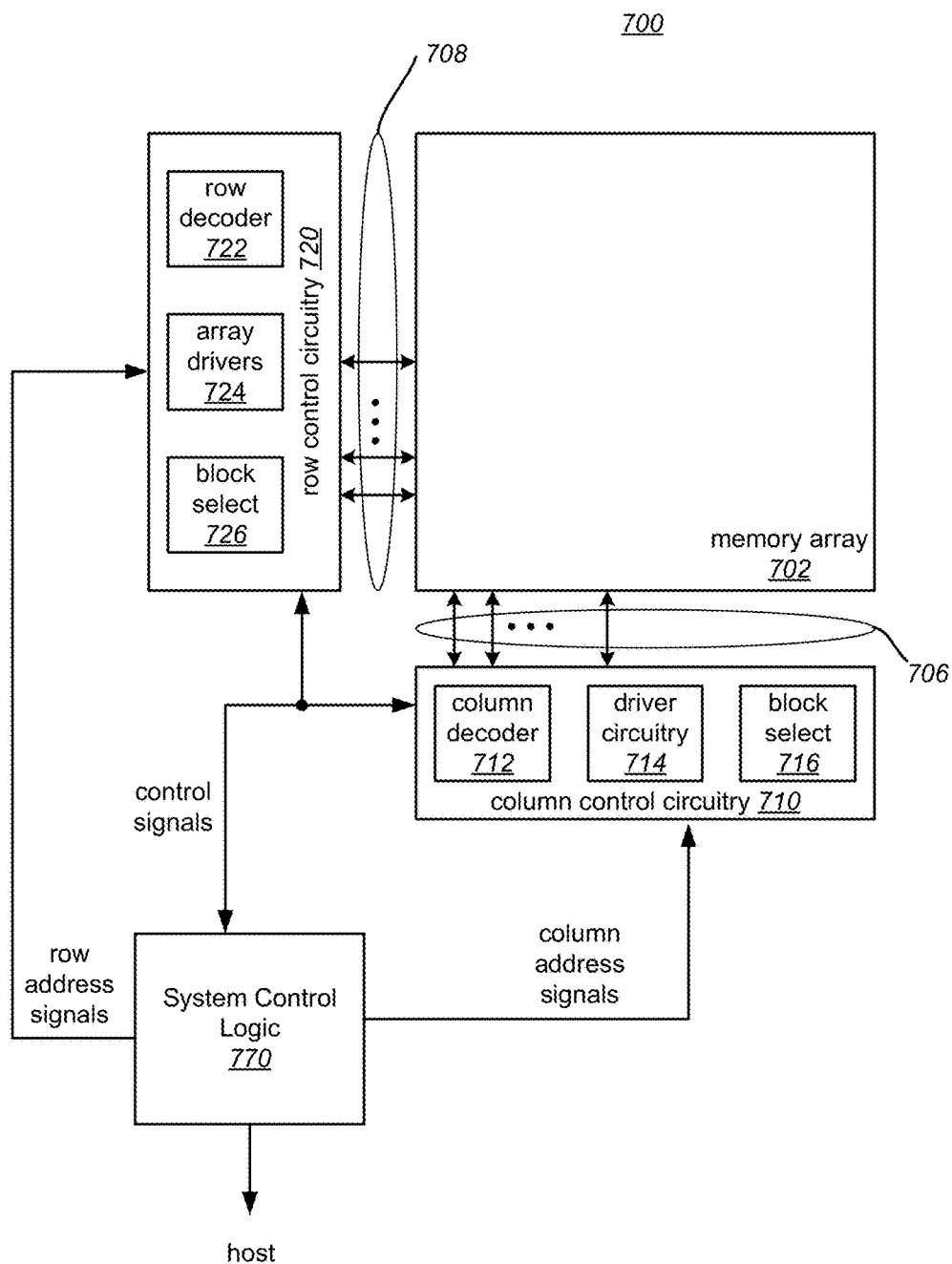
FIG. 7 is a block diagram of a memory system that includes many MRAM memory cells.

FIG. 7 is a block diagram that depicts one example of a memory system 700 that can implement the technology described herein. Memory system 700 includes a memory array 702 that can include thousands or millions of any of memory cells, as described above with respect to FIGS. 1-6. The array terminal lines of memory array 702 include the various layer(s) of word lines organized as rows, and the various layer(s) of bit lines organized as columns. However, other orientations can also be implemented. Memory system 700 includes row control circuitry 720, whose outputs 708 are connected to respective word lines of the memory array 702. Row control circuitry 720 receives a group of M row address signals and one or more various control signals from System Control Logic circuit 770, and typically may include such circuits as row decoders 722, array terminal drivers 724, and block select circuitry 726 for both reading and writing operations. Memory system 700 also includes column control circuitry 710 whose input/outputs 706 are connected to respective bit lines of the memory array 702. Column control circuitry 706 receives a group of N column address signals and one or more various control signals from System Control Logic 770, and typically may include such circuits as column decoders 712, array terminal receivers or drivers 714, block select circuitry 716, as well as read/write circuitry, and I/O multiplexers. System control logic 770 receives data and commands from a host and provides output data to the host. In other embodiments, system control logic 770 receives data and commands from a separate controller circuit and provides output data to that controller circuit, with the controller circuit communicating with the host. System control logic 770 may include one or more state machines, registers and other control logic for controlling the operation of memory system 700.

In one embodiment, all of the components depicted in FIG. 7 are arranged on a single integrated circuit. For example, system control logic 770, column control circuitry 710 and row control circuitry 720 are formed on the surface of a substrate and memory array 702 is a monolithic memory array formed above the substrate (and, therefore, above system control logic 770, column control circuitry 710 and row control circuitry 720). In some cases, a portion of the control circuitry can be formed on the same layers as some of the memory array.

Integrated circuits incorporating a memory array usually subdivide the array into a number of sub-arrays or blocks. Blocks are contiguous group of memory cells having contiguous word and bit lines generally unbroken by decoders, drivers, sense amplifiers, and input/output circuits.

In one embodiment, any one or any combination of row control circuitry 720, row decoders 722, array drivers 724, block selects 726, column control circuitry 710, column decoders 712, driver circuitry 714, block select circuits 716 and/or system control logic 770 can be considered a control circuit that is connected to the memory cells of memory array 702 and configured to program non-volatile data into the memory cell by changing the direction of magnetization of the free layers of the memory cells.

Figure 9A:
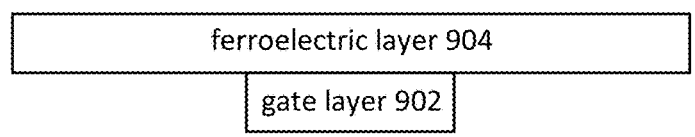
FIGS. 9A-9D depict various stages of a MRAM memory cell being manufactured according to the process of FIG. 8.

FIG. 8 is a flowchart describing one embodiment of a process of manufacturing the MRAM memory cell of FIG. 1 to be part of a cross point memory array (or other memory structure) as depicted in FIGS. 5 and 6. In step 802, a gate layer is deposited and patterned on a substrate or on an insulator layer. For example, bottom gate electrode 124 of FIG. 1 is deposited on a substrate. Photoresist and a hard mask are used to pattern the bottom gate layer into rails. In step 804, a ferroelectric layer is deposited on top of the gate layer. For example, a thin polarized film of hafnium zirconium oxide ($Hf_{0.5}Zr_{0.5}O_2$) is deposited on a bottom lead where the thermal processing budget remains below 400 degrees Celsius. Furthermore, the hafnium zirconium oxide film can be deposited by conformal ALD (atomic layer deposition) as an option for three dimensional integrated devices. In some embodiments, the film is deposited with temperatures being between 200 and 400 degrees Celsius. In other embodiments, the film is deposited with temperatures being between 300 and 400 degrees Celsius. The high temperature converts the hafnium zirconium oxide to a ferroelectric layer. In one embodiment, the hafnium zirconium oxide film has a thickness that is less than 20 nm. FIG. 9A depicts the structure at the conclusion of step 804. As can be seen, there is a ferroelectric layer 904 on top of gate layer 902. Gate layer 902 was deposited in step 802. The ferroelectric layer 904 was deposited in step 804. Because gate layer 902 was patterned in step 802, it appears to be narrower in FIG. 9A. In one embodiment, ferroelectric layer 904 is analogous to ferroelectric layers 534 and 538 of FIG. 5.

Figure 9B:
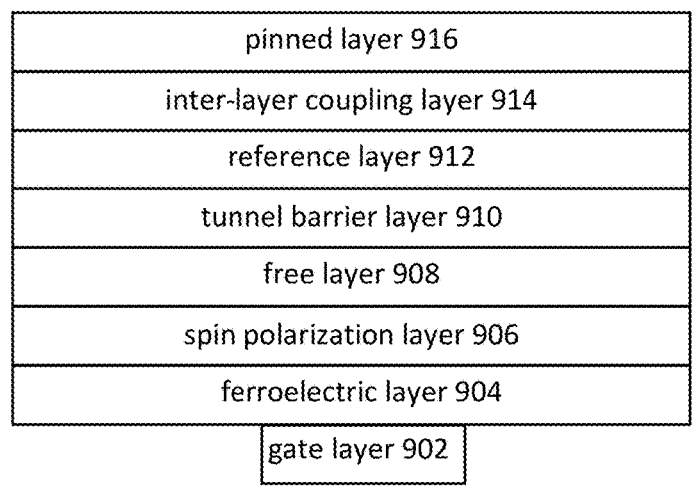

In step 806 of FIG. 8, a spin polarization layer is deposited on top of the ferroelectric layer. In step 808, a free layer is deposited on top of the spin polarization layer. In step 810, a tunnel barrier layer is deposited on top of the free layer. In step 812, a reference layer is deposited on top of the tunnel barrier. In step 814, an inter-layer coupling layer is deposited on top of the reference layer. In step 816, a pinned layer is deposited on top of the inter-layer coupling layer. The depositing of steps 806 through 816 can be performed using sputtering ALD, CVD (chemical vapor deposition) or other processes. FIG. 9B depicts the structure at the conclusion of step 816. As can be seen, the structure includes gate layer 902, ferroelectric layer 904 on top of gate layer 902, spin polarization layer 906 above ferroelectric layer 904, free layer 908 on top of spin polarization layer 906, tunnel barrier layer 910 above free layer 908, reference layer 912 on top of tunnel barrier layer 910, inter-layer coupling layer 914 above reference layer 912, and pin layer 916 above inter-layer coupling layer 914. Spin polarization layer 906 is analogous to spin polarization layer 532 and 536 of FIG. 5.

Figure 9C:
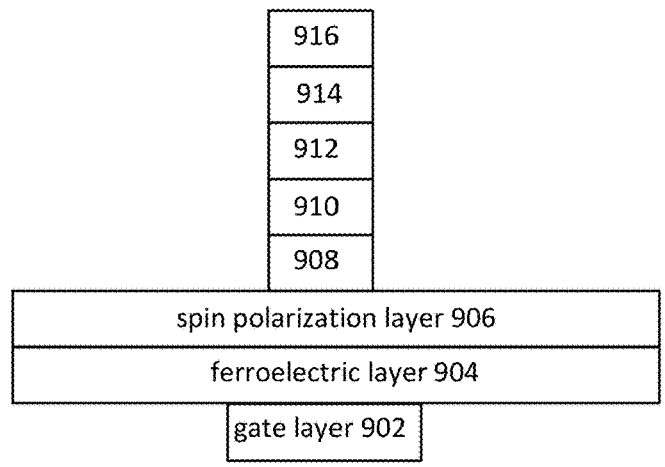

In step 818 of FIG. 8, using photo resist and a hard mask, patterning is performed for the magnetic tunnel junction. Ion mill itching with feedback from materials using ion mass spectroscopy is used to etch the pinned layer, inter-layer coupling layer, reference layer, tunnel barrier and free layer. In one embodiment, the magnetic tunnel junction stack etched in step 918 is etched into a circle. In other embodiments, the magnetic tunnel junction stack is etched into an ellipse or other shape. FIG. 9C depicts a side cross sectional view of the structure after step 818. As can be seen, free layer 908, tunnel barrier layer 910, reference layer 912, inter-layer coupling layer 914 and pinned layer 916 have been etched (and, therefore, appear narrower). However, ferroelectric layer 904 and spin polarization layer 906 has not yet been etched. Gate layer 902 was previously patterned. Note that the width and alignment of the gate layer 902 and may not be the same as layers 908-916. Free layer 908, tunnel barrier layer 910, reference layer 912, inter-layer coupling layer 914 and pinned layer 916 correspond to MTJ 101 of FIG. 1 and any of magnetic tunnel junctions 502, 504, 506 or 508 of FIG. 5.

Figure 9D:
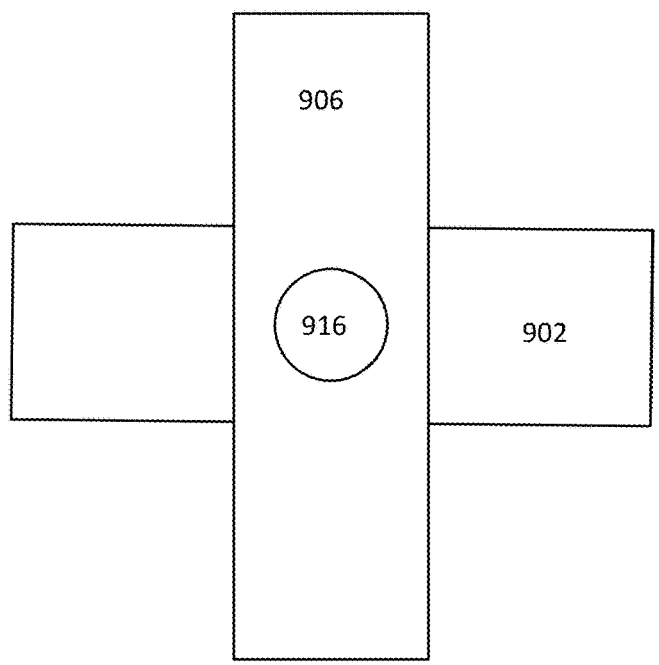

In step 820 of FIG. 8, photoresist and a hard mask is used to pattern the spin polarization layer 906 and ferroelectric layer 904 into rails. Ion mill etching with feedback from materials using ion mass spectroscopy will be used to etch the spin polarization layer and ferroelectric layer. Alternatively, reactive ion etching can be used. FIG. 9D depicts a bird's eye view of the structure at the conclusion of step 820. The top of pinned layer 916 is depicted as a circle representing the etching of layers 908-916. It can be seen that gate layer 902 is a rail that is orthogonal to spin polarization layer 906. Ferroelectric layer 904 is underneath spin polarization layer 906 and has been etched to the same shape as spin polarization layer 906. Thus, the spin polarization layer 906 and ferroelectric layer 904 are etched in step 820 to a first common pattern that is elongated in a first direction while the bottom gate electrode 902 was etched in step 892 to a second pattern that is elongated in a second direction orthogonal to the first direction, and the magnetic tunnel junction stack is etched in step 818 into a shape that is not elongated and is different than the first pattern and the second pattern.

In step 824 of FIG. 8, open space in the structure is filled with an insulator, such as silicon oxide (SiO2). In step 826, the top electrode is deposited using ALD, CVD or another process. In step 828, the top electrode is patterned to form a rail that is in the same direction as the bottom gate electrode that was patterned and etched in step 802. The result of steps 802-828 is the structure of FIGS. 5 and 6. Thus, steps 802-806 and 820 of FIG. 8 include forming a bottom electrode stack comprising a ferroelectric layer and a nonmagnetic spin polarization layer. Steps 808-818 of FIG. 8 include forming magnetic tunnel junction stack above the bottom electrode stack.

Figure 10A:
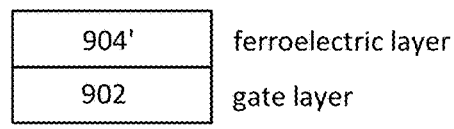
FIGS. 10A-10D depict various stages of a MRAM memory cell being manufactured.

FIGS. 5 and 9A-D depict an embodiment in which the ferroelectric layers are the same shape, size and orientation as the spin polarization layers, and orthogonal to the gate electrode layers. In an alternative embodiment, the ferroelectric layers are the same shape, size and orientation as the gate electrode layers, and orthogonal to the spin polarization layers. The process of FIG. 8 can be used, with small adaptions, to manufacture memory according to this alternative embodiment. FIGS. 10A-D depict various stages of a MRAM memory cell being manufactured according to the process of FIG. 8 according to the alternative embodiment. In the alternative embodiment, steps 802 and 804 would include depositing and patterning the gate layer and the ferroelectric layer to the same shape, size and orientation. For example, FIG. 10A depicts the gate layer 902 and the ferroelectric layer 904' in the same shape, size and orientation. In the alternative embodiment, step 820 would include patterning/etching the spin polarization layer without needing to patterning/etching the ferroelectric layer.

Figure 10B:
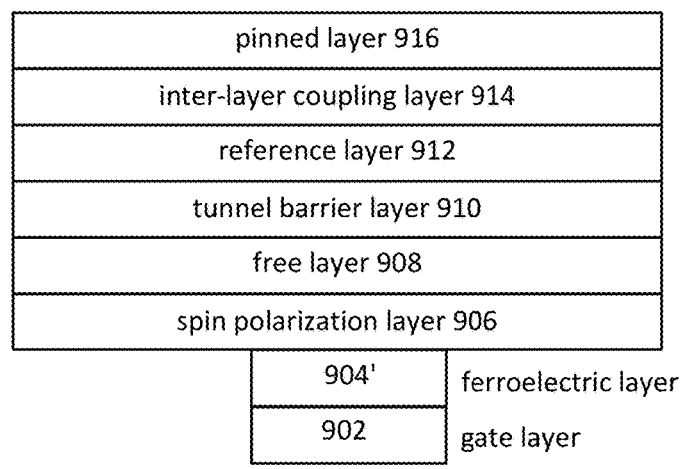

FIG. 10B depicts the structure at the conclusion of step 816 in the alternative embodiment. As can be seen, the structure includes gate layer 902 and ferroelectric layer 904' etched to a narrower profile than spin polarization layer 906, free layer 908, tunnel barrier layer 910, reference layer 912, inter-layer coupling layer, and pin layer 916.

Figure 10C:
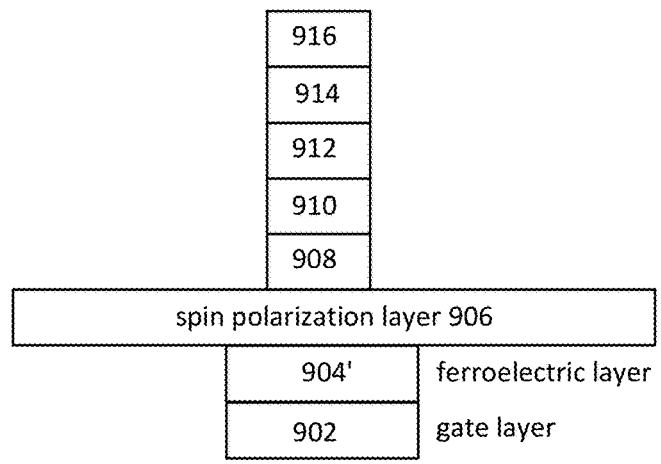

FIG. 10C depicts a side cross sectional view of the structure after step 818 in the alternative embodiment. As can be seen, free layer 908, tunnel barrier layer 910, reference layer 912, inter-layer coupling layer 914 and pinned layer 916 have been etched (and, therefore, appear narrower). However, spin polarization layer 906 has not yet been etched. Gate layer 902 and ferroelectric layer 904' were previously patterned. Note that the width and alignment of the gate layer 902 and ferroelectric layer 904' may not be the same as layers 908-916.

Figure 10D:
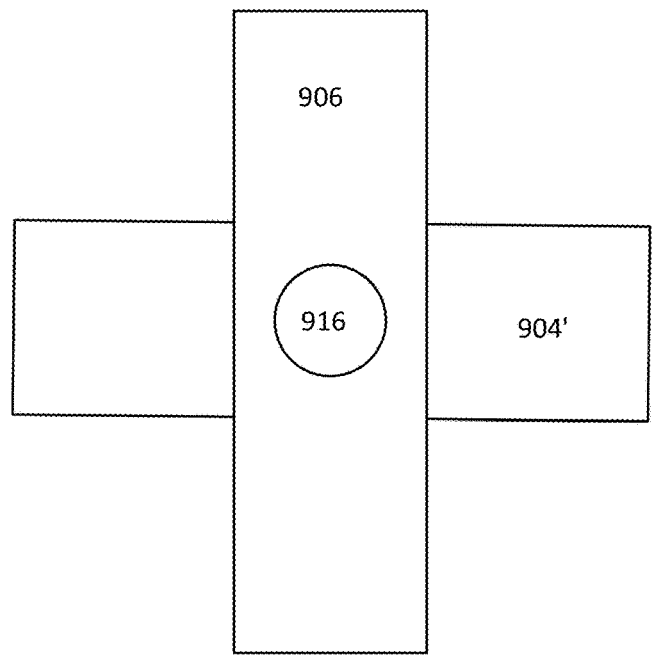

FIG. 10D depicts a bird's eye view of the structure at the conclusion of step 820 in the alternative embodiment. The top of pinned layer 916 is depicted as a circle representing the etching of layers 908-916. It can be seen that ferroelectric layer 904' is a rail that is orthogonal to spin polarization layer 906. Gate layer 902 is underneath ferroelectric layer 904' and has been etched to the same shape as spin polarization layer 904'.

The above description describes the structure, operation and method of manufacture of a new MRAM memory cell that switches deterministically.

One embodiment includes an apparatus, comprising a magnetic tunnel junction stack, a ferroelectric layer and a non-ferromagnetic spin polarization layer between the magnetic tunnel junction stack and the ferroelectric layer.

One example set of embodiments further includes an electrically conductive gate layer in contact (including electrical contact) with the ferroelectric layer.

In one example implementation, the ferroelectric layer and the non-ferromagnetic spin polarization layer are configured such that an external voltage received at the ferroelectric layer creates an electric field across the ferroelectric layer to alter spin current generated in the non-ferromagnetic spin polarization layer to generate perpendicular spin polarization that applies a torque to the magnetic tunnel junction stack.

One embodiment includes an apparatus comprising a free layer capable of changing direction of magnetization, a pinned layer in proximity to the free layer with the pinned layer having a fixed direction of magnetization, an insulation layer between the pinned layer and the free layer and means for generating electrical current induced perpendicular spin polarization that applies a torque on the free layer to change direction of magnetization of the free layer.

One embodiment includes an apparatus comprising a plurality of non-volatile memory cells arranged in a cross point array. Each of the memory cells comprises a magnetic tunnel junction stack connected to a first terminal, a ferroelectric layer, a metal layer between the magnetic tunnel junction stack and the ferroelectric layer, and an electrically conductive gate layer in contact with said ferroelectric layer and connected to a second terminal. The metal layer is connected to a third terminal and a fourth terminal. The metal layer is configured to generate perpendicular spin polarization by running current between the third terminal and the fourth terminal while the gate layers receives a voltage at the second terminal.

One embodiment includes an method comprising writing first data to a magnetic tunnel junction stack, comprising: applying an in-plane electrical current in a first direction across a non-ferromagnetic spin polarization layer that is positioned between the magnetic tunnel junction stack and a ferroelectric layer; and applying a voltage to a gate layer in contact with the ferroelectric layer, while applying the in-plane electrical current in the first direction across a non-ferromagnetic spin polarization layer, to generate perpendicular spin polarization in the non-ferromagnetic spin polarization layer that applies a torque to the magnetic tunnel junction stack to change direction of magnetization of a portion of the magnetic tunnel junction stack.

One embodiment includes an method comprising forming a bottom electrode stack comprising a ferroelectric layer and a non-ferromagnetic spin polarization layer; and forming a magnetic tunnel junction stack above the bottom electrode stack.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them. A connection includes an electrical connection or a mechanical connection, and can also include two materials in contact For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a magnetic tunnel junction stack;
   a ferroelectric layer; and
   a non-ferromagnetic spin polarization layer between the magnetic tunnel junction stack and the ferroelectric layer, the non-ferromagnetic spin polarization layer configured to generate spin polarization, the ferroelectric layer configured such that an external voltage received at ferroelectric layer creates an electric field across the ferroelectric layer that alters spin current generated in the non-ferromagnetic spin polarization layer to generate perpendicular spin polarization that applies a torque to the magnetic tunnel junction stack.

2. The apparatus of claim 1, wherein:
   the non-ferromagnetic spin polarization layer is configured to generate perpendicular spin polarization in response to electrical current through the non-ferromagnetic spin polarization layer and the external voltage received at the ferroelectric layer.

3. The apparatus of claim 1, further comprising:
   an electrically conductive gate layer in contact with the ferroelectric layer;

a first terminal connected to the magnetic tunnel junction stack;
a second terminal connected to the gate layer;
a third terminal connected to the non-ferromagnetic spin polarization layer; and
a fourth terminal connected to the non-ferromagnetic spin polarization layer.

4. The apparatus of claim 3, wherein:
the non-ferromagnetic spin polarization layer is configured to generate perpendicular spin polarization in response to electrical current between the third terminal and the fourth terminal while receiving the external voltage at the second terminal.

5. The apparatus of claim 4, wherein:
the magnetic tunnel junction stack includes a first layer with fixed direction of magnetization connected to the first terminal, a magnetic free layer capable of changing direction of magnetization and an insulation layer between the first layer and the free layer; and
the perpendicular spin polarization exerts a torque on the free layer without an electrical current running through the magnetic tunnel junction stack.

6. The apparatus of claim 5, wherein:
the free layer is configured to be read by sensing resistance of the magnetic tunnel junction in response an electrical current through the magnetic tunnel junction from the first terminal to either of the third terminal or the fourth terminal.

7. The apparatus of claim 4, wherein:
the magnetic tunnel junction stack includes a first layer with fixed direction of magnetization connected to the first terminal, a magnetic free layer capable of changing direction of magnetization and an insulation layer between the first layer and the free layer; and
the perpendicular spin polarization exerts a torque on the free layer in response to an electrical current running through the magnetic tunnel junction stack.

8. The apparatus of claim 4, wherein:
the ferroelectric layer is planar;
the non-ferromagnetic spin polarization layer is planar;
the electrical current is in-plane; and
the perpendicular spin polarization is perpendicular to the in-plane electrical current.

9. The apparatus of claim 1, wherein:
the ferroelectric layer is $Hf_{0.5}Zr_{0.5}O_2$ and has a thickness of less than 30 nm.

10. The apparatus of claim 1, wherein:
the non-ferromagnetic spin polarization layer comprises a metal with an atomic number greater than 72.

11. The apparatus of claim 1, further comprising:
an electrically conductive gate layer in contact with the ferroelectric layer, the external voltage is received at the gate layer.

12. The apparatus of claim 1, wherein:
the ferroelectric layer is planar;
the non-ferromagnetic spin polarization layer is planar; and
the magnetic tunnel junction stack, the ferroelectric layer and the non-ferromagnetic spin polarization layer comprise a magnetoresistive memory cell.

13. An apparatus, comprising:
a free layer capable of changing direction of magnetization;
a pinned layer in proximity to the free layer, the pinned layer having a fixed direction of magnetization;
an insulation layer between the pinned layer and the free layer; and
means for generating electrical current induced perpendicular spin polarization that applies a torque on the free layer to change direction of magnetization of the free layer.

14. The apparatus of claim 13, further comprising:
a first terminal connected to the pinned layer;
a second terminal, a third terminal and a fourth terminal connected to the means for generating electrical current induced perpendicular spin polarization, the means for generating electrical current induced perpendicular spin polarization is configured to generate perpendicular spin polarization in response to current between the third terminal and the fourth terminal while receiving a voltage at the second terminal.

15. The apparatus of claim 13, wherein:
the means for generating electrical current induced perpendicular spin polarization comprises a ferroelectric layer and a non-ferromagnetic spin polarization layer between the free layer and the ferroelectric layer.

16. The apparatus of claim 15, further comprising:
a first terminal connected to the pinned layer;
a second terminal connected to the ferroelectric layer;
a third terminal connected to the non-ferromagnetic spin polarization layer; and
a fourth terminal connected to the non-ferromagnetic spin polarization layer, the non-ferromagnetic spin polarization layer is configured to generate perpendicular spin polarization that applies the torque to the free layer in response to an electrical current between the third terminal and the fourth terminal while receiving a voltage at the second terminal.

17. Apparatus, comprising:
a plurality of non-volatile memory cells arranged in a cross point array, each of the memory cells comprises:
a magnetic tunnel junction stack connected to a first terminal;
a ferroelectric layer;
a metal layer between the magnetic tunnel junction stack and the ferroelectric layer; and
an electrically conductive gate layer in contact with said ferroelectric layer and connected to a second terminal, the metal layer is connected to a third terminal and a fourth terminal, the metal layer is configured to generate perpendicular spin polarization by running current between the third terminal and the fourth terminal while the gate layers receives a voltage at the second terminal.

18. The apparatus of claim 17, wherein:
the metal layer is non-ferromagnetic;
the magnetic tunnel junction stack includes a first layer with fixed direction of magnetization connected to the first terminal, a second layer capable of changing direction of magnetization in proximity to the metal layer and an insulation layer between the first layer and the second layer; and
the generated perpendicular spin polarization exerts a torque on the second layer to change direction of magnetization of the second layer without an electrical current through the insulation layer that is greater than 1 $MA/cm^2$.

* * * * *